(12) United States Patent
North (10) Patent No.: US 12,293,611 B2
(45) Date of Patent: May 6, 2025

(54) DATA EXTRACTION FOR MACHINE LEARNING SYSTEMS AND METHODS

(71) Applicant: Transportation IP Holdings, LLC, Norwalk, CT (US)

(72) Inventor: Nathan Thomas North, Seattle, WA (US)

(73) Assignee: Transportation IP Holdings, LLC, Norwalk, CT (US)

( * ) Notice: Subject to any disclaimer, the term of this patent is extended or adjusted under 35 U.S.C. 154(b) by 246 days.

(21) Appl. No.: 17/394,022

(22) Filed: Aug. 4, 2021

(65) Prior Publication Data

US 2022/0044494 A1 Feb. 10, 2022

Related U.S. Application Data (60) Provisional application No. 63/062,438, filed on Aug. 6, 2020.

(51) Int. Cl.
G07C 5/00 (2006.01)
G05B 23/02 (2006.01)
(Continued)

(52) U.S. Cl.
CPC ......... *G07C 5/006* (2013.01); *G05B 23/0243* (2013.01); *G06F 30/27* (2020.01);
(Continued)

(58) Field of Classification Search
CPC ...... G07C 5/006; G07C 5/008; G07C 5/0825; G07C 5/0833; G06F 30/27; G05B 23/0243
(Continued)

(56) References Cited

U.S. PATENT DOCUMENTS 8,674,993 B1 * 3/2014 Fleming ............... G06Q 40/06
707/794
10,048,995 B1 * 8/2018 Dikhit ............... G06F 11/0709
(Continued)

FOREIGN PATENT DOCUMENTS

CN 103077163 A 5/2013

OTHER PUBLICATIONS

Examination report No. 1 for corresponding Australian Patent Application 2021212073 mailed Jul. 7, 2022.
(Continued)

*Primary Examiner* — Kurt Philip Liethen
*Assistant Examiner* — John D Bailey
(74) *Attorney, Agent, or Firm* — K&L Gates LLP (57) ABSTRACT

A system (e.g., a maintenance system) includes a maintenance task input unit and one or more processors. The maintenance task input unit is configured to generate plural input data groups corresponding to a maintenance task. Each of the input data groups is in a corresponding one of plural formats. The one or more processors are coupled to the maintenance task input unit and configured to obtain the plural input data groups from the maintenance task input unit. The one or more processors are configured to identify a particular format of the formats for each input data group, and to prepare an intermediate representation of the input representation based on the particular format that is identified. Also the one or more processors are configured to modify the intermediate representation to provide a model input having a common format. The one or more processors are configured to modify intermediate representations corresponding to each of the input data groups to the common format, and to provide the model input to a maintenance system artificial intelligence modeler that is configured to
(Continued)

use the model input to at least one of develop or use a model using the model input for vehicle maintenance.

18 Claims, 3 Drawing Sheets

(51) Int. Cl.
    *G06F 30/27*           (2020.01)
    *G07C 5/08*            (2006.01)

(52) U.S. Cl.
    CPC ........... *G07C 5/008* (2013.01); *G07C 5/0825* (2013.01); *G07C 5/0833* (2013.01)

(58) Field of Classification Search
    USPC ...................................................... 701/31.4
    See application file for complete search history.

(56) References Cited

U.S. PATENT DOCUMENTS

| | | | | |
|---|---|---|---|---|
| 11,244,233 | B2* | 2/2022 | Sturtivant | G06F 8/61 |
| 2002/0169735 | A1* | 11/2002 | Kil | G06N 5/022 |
| | | | | 706/46 |
| 2007/0094181 | A1* | 4/2007 | Tayebnejad | G06Q 40/08 |
| | | | | 706/21 |
| 2008/0114474 | A1* | 5/2008 | Campbell | G05B 19/4183 |
| | | | | 700/89 |
| 2013/0124465 | A1* | 5/2013 | Pingel | H04L 67/12 |
| | | | | 707/610 |
| 2013/0212420 | A1* | 8/2013 | Lawson | G06F 16/9535 |
| | | | | 713/400 |
| 2014/0047107 | A1* | 2/2014 | Maturana | G05B 19/056 |
| | | | | 709/224 |
| 2014/0222522 | A1* | 8/2014 | Chait | G06Q 10/0637 |
| | | | | 705/7.36 |
| 2014/0335480 | A1* | 11/2014 | Asenjo | G06Q 10/06 |
| | | | | 434/107 |
| 2014/0337000 | A1* | 11/2014 | Asenjo | G06Q 10/06 |
| | | | | 703/13 |
| 2014/0337429 | A1* | 11/2014 | Asenjo | H04L 67/10 |
| | | | | 709/204 |
| 2015/0105968 | A1* | 4/2015 | Ho | G06Q 10/20 |
| | | | | 701/31.5 |
| 2015/0120009 | A1* | 4/2015 | Killian | G05B 23/0291 |
| | | | | 700/79 |
| 2015/0277406 | A1* | 10/2015 | Maturana | G06F 9/451 |
| | | | | 700/83 |
| 2015/0281356 | A1* | 10/2015 | Maturana | G06F 9/5072 |
| | | | | 709/217 |
| 2016/0179599 | A1* | 6/2016 | Deshpande | H04L 65/75 |
| | | | | 714/807 |
| 2016/0299999 | A1* | 10/2016 | James | G06F 30/20 |
| 2017/0308802 | A1* | 10/2017 | Ramsøy | G06N 20/00 |
| 2017/0351241 | A1* | 12/2017 | Bowers | G05B 19/406 |
| 2017/0358204 | A1* | 12/2017 | Modica | H04W 4/021 |
| 2018/0349433 | A1* | 12/2018 | Baines | G06F 16/258 |
| 2018/0356800 | A1* | 12/2018 | Chao | G06F 16/10 |
| 2020/0151611 | A1* | 5/2020 | McGavran | G09B 29/102 |
| 2020/0167643 | A1* | 5/2020 | Bivens | G06N 5/01 |
| 2020/0327371 | A1* | 10/2020 | Sharma | H04L 67/34 |
| 2021/0094561 | A1* | 4/2021 | Jiang | B60W 50/045 |

OTHER PUBLICATIONS

Second Examination Report mailed Oct. 24, 2022 for corresponding Australian Patent Application No. 2021212073 (4 pages).
Office Action for Japanese Patent Application No. 2021-129210 dated Oct. 31, 2022 (and English Translation).
Extended European Search Report mailed Jan. 5, 2022 for corresponding European Patent Application No. 21189870.5 (10 pages).
Office Action mailed Oct. 24, 2022 for corresponding European Patent Application No. 21 189 870.5 (4 pages).

\* cited by examiner

DATA EXTRACTION FOR MACHINE LEARNING SYSTEMS AND METHODS

RELATED APPLICATIONS

This application claims priority to U.S. patent application Ser. No. 63/062,438, entitled "Data Extraction for Machine Learning Systems and Methods," filed Aug. 6, 2020, the entire subject matter of which is incorporated by reference herein.

BACKGROUND

Technical Field

The subject matter described relates to systems and methods for use in conjunction with data extraction for machine learning, for example to develop and/or use an artificial intelligence model to maintain components of a vehicle.

DISCUSSION OF ART

Machine learning and artificial intelligence (AI) models may receive input data to be used in a matrix format, although numerical matrix data may not be an allowed input. Accordingly, a translation may be performed as a pre-processing step to many AI models. However, deployment difficulties may arise based on input types, and current translational approaches are inefficient with respect to using or translating different types of inputs.

BRIEF DESCRIPTION

In one embodiment, a system (e.g., a maintenance system) includes a maintenance task input unit and one or more processors. The maintenance task input unit is configured to generate plural input data groups corresponding to a maintenance task. Each of the input data groups is in a corresponding one of plural formats. The one or more processors are coupled to the maintenance task input unit and configured to obtain the plural input data groups from the maintenance task input unit. The one or more processors are configured to identify a particular format of the formats for each input data group, and to prepare an intermediate representation of the input data based on the particular format that is identified. Also the one or more processors are configured to modify the intermediate representation to provide a model input having a common format. The one or more processors are configured to modify intermediate representations corresponding to each of the input data groups to the common format, and to provide the model input to a maintenance system artificial intelligence modeler that is configured to use the model input to at least one of develop or use a model using the model input for vehicle maintenance.

In one embodiment, a method includes obtaining plural input data groups of input information corresponding to a maintenance task. Each of the input data groups is in a corresponding one of a plurality of formats. The method also includes identifying a particular format of the plurality of formats for each input data group, and preparing an intermediate representation of the input data based on the particular format that is identified for each input data group. Further, the method includes modifying the intermediate representation to provide a model input having a common format. Intermediate representations corresponding to each of the plurality of inputs are modified to the common format. The method also includes providing the model input to an artificial intelligence modeler that is configured to use the model input to at least one of develop or use a model using the model input.

In one embodiment, a method includes performing a maintenance task, and generating input data including information corresponding to the maintenance task. The method also includes obtaining, with one or more processors, the input data of input information in a corresponding one of a plurality of formats. Further, the method includes identifying a particular format of the plurality of formats for the input data, and preparing an intermediate representation of the input data based on the particular format that is identified. The method also includes modifying the intermediate representation to provide a model input having a common format. The intermediate representations corresponding to each of the plurality of inputs are modified to the common format. Further, the method includes providing the model input to an artificial intelligence modeler that is configured to use the model input to at least one of develop or use a model using the model input.

BRIEF DESCRIPTION OF THE DRAWINGS

The inventive subject matter may be understood from reading the following description of non-limiting embodiments, with reference to the attached drawings, wherein below.

DETAILED DESCRIPTION

Embodiments of the subject matter described herein relate to systems and methods for translating or converting information for use with artificial intelligence (AI) modeling based on input configuration or type of input received. For example, given an incoming PNG file, a corresponding image may be reshaped, extracted, and re-formatted to match a format used by an AI model. In various embodiments, a front end performs conversions from specific incoming file format to corresponding intermediate n-dimensional array ("ND array") representations, and the back end performs additional post-processing such as reshaping, resizing, performance of linear algebraic methods, and/or channel alignment, among other tasks.

Various embodiments provide a technical effect allowing use of AI input data of multiple different types. Various embodiments provide a technical effect of improving the efficiency and convenience of developing and/or using AI models. Various embodiments provide a technical effect of improving planning, performance, and/or evaluation of maintenance tasks.

While various examples herein may be discussed in connection with rail vehicles, it may be noted that not all embodiments described herein are limited to rail vehicle systems. For example, one or more embodiments of the maintenance systems and methods described herein can be used in connection with other types of vehicles, such as automobiles, trucks, buses, mining vehicles, marine vessels, aircraft, agricultural vehicles, or the like. In some embodiments, such vehicles may be gas-powered, diesel-powered, electric-powered, or powered via other appropriate propulsion systems, including hybrid systems that include multiple systems for powering the vehicles. In other embodiments, the maintenance system and methods described herein may be utilized in connection with non-vehicular systems.

Accordingly, various embodiments may be utilized in applications other than maintenance activities and/or transportation. For example, machine learning models in commerce, finance, agriculture, or internet applications, among others, may be used in conjunction with various embodiments.

Figure 1:
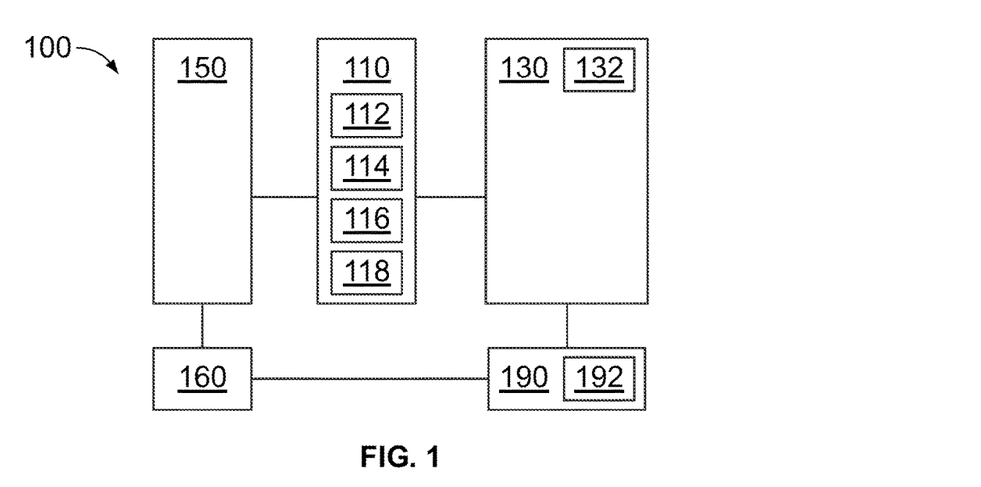
FIG. 1 illustrates a block schematic diagram of a system.

FIG. 1 illustrates a schematic diagram of a system 100. The system (e.g., a maintenance system) includes a maintenance task input unit 110 and a processing unit 130. The maintenance task input unit 110 is configured to generate plural input data groups corresponding to a maintenance task. Each of the input data groups is in a corresponding one of plural formats. For example, input data groups can include image files, text files, video files, and audio files, with each file having a corresponding format that is different from formats of other files (e.g., image files having a different format from text files, video files, and audio files). Files of a given type may also have a corresponding format that is different from formats of other files, even from files of the same type (e.g., image files stored as JPG, image files stored as PNG, image files stored as RAW, and image files stored in other appropriate formats). It should be noted that other types of files and/or formats may be utilized in alternate embodiments.

The system 100 in various embodiments is a maintenance system for use in connection with a maintenance task. As used herein, a maintenance task may be understood as including one or more actions (e.g., physical actions) performed to maintain one or more components 150 (e.g., vehicle maintenance includes one or more actions performed to maintain a vehicle or components thereof). The maintenance task input unit 110 (or aspects thereof) in various embodiments is located at or near the component 150 being maintained. Maintenance tasks in various embodiments include one or more of inspection, cleaning, repair, or replacement. For example, maintenance of a fan of an engine of a rail vehicle may include inspection of fan blades, cleaning of fan blades, and/or repair or replacement of fan blades found to be damaged. In various embodiments, the performance of the maintenance task (e.g., cleaning, repair, replacement) results in a tangible change or transformation of one or more physical components. In conjunction with a maintenance task, various types of files may be generated and provided to the processing unit 130.

For example, one or more image files corresponding to a static picture or other type of image may be generated by the maintenance input unit 110. In the illustrated example, the maintenance task input unit 110 includes an imaging input unit 112 that is configured to generate image files in a corresponding format that describes, depicts, or otherwise relates to performance of a maintenance task or aspect thereof. In various embodiments, the imaging input unit 112 may include a camera or x-ray unit. Image files in various embodiments include, by way of example, digital optical images obtained using a camera or other optical sensor, or, as another example, x-ray imaging information. Image files may be in color, utilizing color channels assigned to predetermined colors (e.g., red, green, blue). Image files, as another example, may be in black and white or greyscale, with varying intensity values assigned corresponding to shades. In the context of the above described fan maintenance example, image files may be generated to assess damage and/or state of cleaning of a fan blade or other component. As another example, image files may be utilized after performance of a maintenance task to help assess the sufficiency, effectiveness, or success of a maintenance task.

As another example, one or more text files corresponding to a maintenance task may be generated. For example, one or more text files corresponding to an input provided by an operator may be generated. In the illustrated example, the maintenance task input unit 110 includes a text input unit 114 that is configured to generate text files in a corresponding format that describes, depicts, or otherwise relates to performance of a maintenance task or aspect thereof. In various embodiments, the text input unit 114 may include a keyboard, keypad, touch screen, or other manual entry device, or, as another example, may include a microphone and dictation or translation software. Text files in various embodiments include, by way of example, text files including descriptions or other information provided by an operator performing or otherwise associated with a maintenance task. In the context of the above described fan maintenance example, text files may be generated to describe a task being performed, or to indicate a state of progress of a maintenance task. The input may be generated with the assistance or guidance of prompts to an operator. For example, an operator may be given a number of choices to describe the status of the task or a description of the component being maintained.

As another example, one or more video files corresponding to a maintenance task may be generated. Video files may be used to provide dynamic information related to components in use that may not be available from a static image of the components. One or more video files corresponding to a component or components in motion may be generated. In the illustrated example, the maintenance task input unit 110 includes a video input unit 116 that is configured to generate video files in a corresponding format that describes, depicts, or otherwise relates to performance of a maintenance task or aspect thereof. In various embodiments, the video input unit 116 may include a digital video camera, for example. Video files in various embodiments include, by way of example, sequences of digital video frames (which may include timing information corresponding to times at which frames were obtained and/or a rate at which frames were obtained) obtained using a video camera or other optical sensor. Video files may be in color, or, as another example, may be in black and white or greyscale. In the context of the above described fan maintenance example, video files may be generated to assess the speed, stability, and/or other dynamic measure of performance of a fan blade (or group of fan blades) or other component. As another example, video files may be utilized after performance of a maintenance task to help assess the sufficiency, effectiveness, and/or success of the maintenance task.

As another example, one or more audio files corresponding to a maintenance task may be generated. For example, one or more audio files corresponding to a sound or group of sounds generated by a component being maintained may be generated. In the illustrated example, the maintenance task input unit 110 includes an audio input unit 118 that is configured to generate audio files in a corresponding format that describes, depicts, or otherwise relates to performance of a maintenance task or aspect thereof. In various embodiments, the audio input unit 118 may include a microphone. In some embodiments, the audio input unit 118 may include a converter for digitizing analog information acquired by a microphone. In the context of the above described fan maintenance example, audio files may be generated to assess a state damage of a fan blade or other component (e.g., via a signature sound or frequency of sound corresponding to a failed or damaged component). For example, an excess amount of noise and/or a specific type of noise may indicate or relate to damage to a particular component or group of components that are then identified for inspection, repair, or replacement, as appropriate. As another example, audio files may be utilized after performance of a maintenance task to help assess the sufficiency, effectiveness, or success of a maintenance task.

Accordingly, in various embodiments, the maintenance task input unit 110 generates the input data by acquiring an input from an operator performing the maintenance task. Alternatively or additionally, in various embodiments, the maintenance task input unit 110 is configured to generate the input data by at least one of acquiring image information or acquiring audio information corresponding to the maintenance task (with the acquiring performed autonomously and/or via operator input).

In the illustrated embodiment, the maintenance task input unit 110 includes a number of types of input units—namely the imaging input unit 112, text input unit 114, video input unit 116, and audio input unit 118. It should be noted that other types of input units may be used in other embodiments additionally or alternatively. Further, it should be noted that while the maintenance task input unit 110 is depicted as a single block or unit, one or more aspects of the maintenance task input unit 110 may be housed separately from other aspects and/or located remotely from other aspects. For example, the processing unit 130 may be configured to receive information (e.g., wirelessly) from a number of different maintenance task inputs 110 and/or receive information for different maintenance tasks being performed at different locations.

The processing unit 130 is coupled to the maintenance task input unit 110 and configured to obtain the plural input data groups from the maintenance task input unit 110. In the illustrated example, each type of input data is provided from the maintenance task input unit 110 to the processing unit 130 in a particular format corresponding to that particular type of input data. The processing unit 130 identifies a particular format from the predetermined, known formats for each received input data group based on the type of input data, and prepares an intermediate representation of the input data based on the particular format that is identified. For example, upon receiving a text file, the processing unit 130 identifies the current file as a text file, identifies the format of the text file, and prepares an intermediate representation of the text file in a particular format corresponding to the received text file. Accordingly, intermediate representations of a first type of file (e.g., text file) are in a first format, intermediate representations of a second type of file (e.g., an audio file) are in a different, second format, and so on.

The intermediate representation format may specify or define a type of ND array (an n-dimensional array). For example, an ND array having an M×N×O format may be used. For instance, an M×N×O array may be used in connection with imaging data to represent the rows, columns, and depth of color channels (e.g., 3 color channels). In various embodiments a matrix (or 2 dimensional array having rows and columns) may be utilized.

By way of example, an ND Array with N=3 (for color image) may be represented as follows:

[
  [
    [r, g, b],
    [r, g, b],
    [r, g, b]
  ],
  [
    [r, g, b],
    [r, g, b],
    [r, g, b]
  ]
]

As another example, an ND Array with N=2 (grayscale image) may be represented as follows:

[
  [g, g, g, g, g, g],
  [g, g, g, g, g, g]
]

It may be noted that the first example has arrays, inside additional arrays, inside an additional array. The second example, on the other hand, has one set of nesting—a set of arrays inside an array. The nesting in various embodiments could go as deep as appropriate to represent any dataset.

In various embodiments, the processing unit 130 prepares the intermediate representation for a given input data type by generating an ND array having an ND array format that corresponds to the particular format identified for the given input data. For example, some intermediate representations may be in the form of a 1×N matrix, while others may be in the form of an M×N matrix, with the values of M and N specified by the format. For example, a matrix generated from a text file may in the form of a 1×N matrix, and a matrix generated from an image file may be in the form of an M×N matrix, where M and N correspond to columns and rows of pixels. In other examples, an ND array having more than 2 dimensions may be utilized. Further, the type of information or form of representation within the ND array may be specified by the particular format for a given intermediate representation and input data type. For example, values entered in an ND array for an image file may correspond to color and/or intensity of corresponding pixels.

The depicted processing unit 130 also modifies the intermediate representation to provide a model input having a common format. The processing unit 130 is configured to modify intermediate representations corresponding to each of the input data groups to the common format. Accordingly, input data groups of different formats are received by the processing unit 130 and used to create model inputs having a common format for improved convenience of modelling.

In various embodiments, the common format of the model input defines a common ND array format. For example, whereas the intermediate representations of the various input data groups begin in a different ND array format from each other, after modification to the model input, they are all in the same ND array format. Accordingly, in various embodiments, the processing unit 130 modifies the intermediate representation to provide the model input by altering at least one of a size or a shape of the ND array of the intermediate representation to match a size and shape of the common format of the model input. It may be noted that the common format may be an ND array that is formatted differently from ND arrays defined by at least some of the intermediate representation formats, but may be in the same format as one of the intermediate representation formats (e.g., the largest ND array of the intermediate representation formats).

Figure 2:
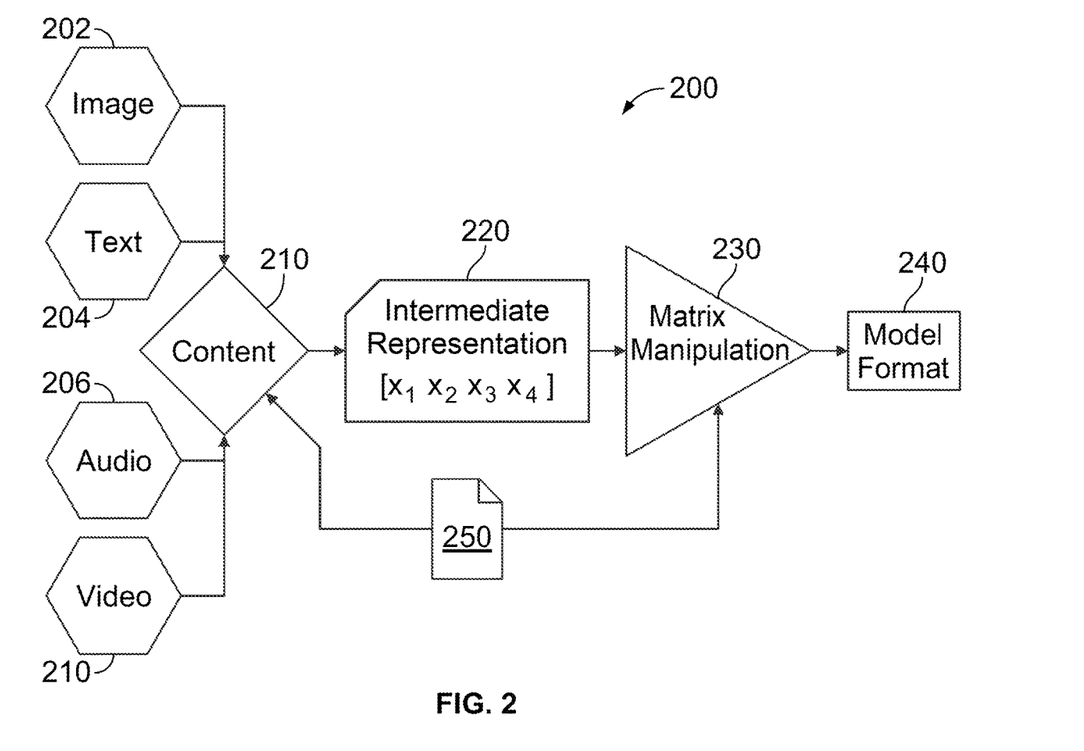
FIG. 2 provides a schematic view of a system flow for the system of FIG. 1.

FIG. 2 schematically depicts a general system flow 200 for the system 100 of FIG. 1. As seen in FIG. 2, a variety of input data groups may be provided. In the illustrated example, image data may be input at block 202, text data may be input at block 204, audio data may be input at block 206, or video data may be input at block 208. As discussed herein, each type of data is input having a corresponding type or format.

At block 210, a received input data is converted to the corresponding intermediate representation 220 based on the input data file type. The intermediate representation accordingly has a particular format that corresponds to the type of input data that was converted at 210 to generate the particular intermediate representation.

Then at block 230, the intermediate representation 220 is modified. For example, an ND array generated as part of the intermediate representation may be altered to a common ND array format that is common to all types of input information after manipulation at block 230. The intermediate representation 220 is modified by the manipulation or modification at 230 into a model input 240 having a model format for providing to an artificial intelligence model. It may be noted that when multiple different input data groups are received, the groups may be processed individually to provide individual model inputs. A configurator block 250 provides blocks 210 and 230 with rules or guidelines to be used in converting or modifying data groups or representations.

Returning to FIG. 1, the depicted processing unit 130 provides the model input to a maintenance system artificial intelligence modeler 190. In some embodiments, the maintenance system artificial intelligence modeler 190 is configured to use the model input to develop a model. For example, the artificial intelligence modeler 190 may receive a number of model inputs corresponding to a particular maintenance task from the processing unit 130 (and, optionally from other processing units), and build an artificial intelligence model for that maintenance task using the received model inputs.

Alternatively or additionally, the artificial intelligence modeler 190 in various embodiments uses a model that utilizes the model input for vehicle maintenance (e.g., maintenance of vehicle or aspect thereof such as fan of engine of vehicle). For example, after the inputs from an operator and/or sensors associated with a maintenance task are received and used to generate model inputs that are provided to the model, the model may use the model inputs to evaluate the maintenance task and/or provide instruction or guidance. For example, the model may determine if the task is complete and/or has been completed satisfactorily. If the task is not complete, the model may provide instruction to an operator for additional steps to be performed. If the task has not been completed satisfactorily, the model may determine which aspect or aspects of the component require further attention and/or what additional steps should be taken as part of the maintenance task, and provide appropriate instruction to an operator or operators performing the maintenance task, and/or control signals to maintenance equipment being controlled to perform the maintenance task.

With continued reference to FIG. 1, the depicted processing unit 130 is coupled to the maintenance task input unit 110 and the maintenance system artificial intelligence modeler 190. For example, the processing unit 130 may receive information from the maintenance task input 110, and provide a corresponding model input (or inputs) to the maintenance system artificial intelligence modeler 190. The processing unit 130 and/or maintenance system artificial intelligence modeler 190 in various embodiments are also configured to provide communication messages and/or command inputs to one or more components 160 of a maintenance system used to maintain the component 150. It should be noted that, while the processing unit 130 and maintenance system artificial intelligence modeler 190 are shown as two separate blocks in FIG. 1, they (or aspects thereof) may be commonly housed or separated into more than two blocks in other embodiments.

The processing unit 130 and/or the artificial intelligence modeler 190 may be located on-board a vehicle being maintained in some embodiments. In other embodiments, the processing unit 130 and/or artificial intelligence modeler may be located remotely from maintenance task input unit 110 and/or a vehicle being maintained. It may be noted that the depicted processing unit 130 in various embodiments is configured to perform one or more aspects of methods discussed herein (e.g., method 300 and/or method 400). Further, the processing unit 130 may include or be coupled to a display that may be used, for example, to provide information and/or instruction to an operator maintaining a component or group of components.

The depicted processing unit 130 includes a memory 132. The processing unit 130 is depicted as including a single processing unit 130; however, the block for the processing unit 130 may be understood as representing one or more processors that may, in some embodiments, be distributed or remote from each other. Also, the depicted artificial intelligence modeller 190 includes a memory 192, and may also be understood as representing one or more processors that may, in some embodiments, be distributed or remote from each other. Further, one or more aspects (such as memory) may be shared between the processing unit 130 and artificial intelligence modeller 190 in various embodiments.

The processing unit 130 in various embodiments includes processing circuitry configured to perform one or more tasks, functions, or steps discussed herein (e.g., system flow 200, methods 300, 400, or aspects thereof). It may be noted that "processing unit" as used herein is not intended to necessarily be limited to a single processor or computer. For example, the processing unit 130 may include multiple processors and/or computers, which may be integrated in a common housing or unit, or which may distributed among various units or housings.

Generally, various aspects (e.g., programmed modules) of the processing unit 130 act individually or cooperatively with other aspects to perform one or more aspects of the methods, steps, or processes discussed herein (e.g., system flow 200, method 300, method 400 or aspects thereof). In the depicted embodiment, the memory 132 (and memory 192) includes a tangible, non-transitory computer readable medium having stored thereon instructions for performing one or more aspects of the methods, steps, or processes discussed herein.

Figure 3:
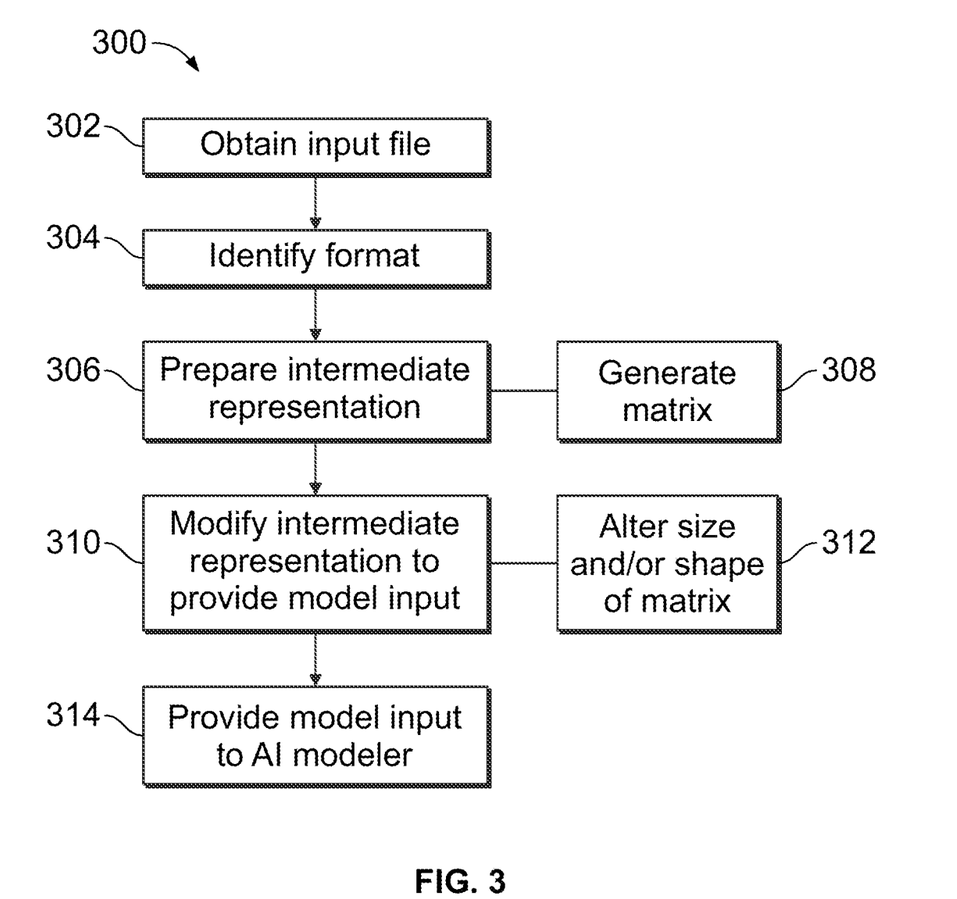
FIG. 3 illustrates a flowchart of a method.

FIG. 3 illustrates a flowchart of a method 300. The operations of FIG. 3 may be implemented by one or more processors (e.g., processing unit 130 and/or artificial intelligence modeler 190) executing program instructions stored in memory. The method 300, for example, may employ structures or aspects of various embodiments (e.g., systems and/or methods) discussed herein, such as the system 100 and/or system flow 200 and/or method 400. In various embodiments, certain steps (or operations) may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. In various embodiments, portions, aspects, and/or variations of the method 300 may be used as one or more algorithms to direct hardware to perform one or more operations described herein. It should be noted, other methods may be used, in accordance with embodiments herein.

At 302, input data groups are obtained (e.g., by processing unit 130 from maintenance task input unit 110). The input data groups may be obtained at the same time or at different times. In various embodiments, each individual input data group is processed according to one or more steps of the method 300, and after that input data has been used to generate a model input, another input data group may subsequently be processed. The input data groups include information corresponding to a maintenance task. Each input data group is in one of a plurality of formats. For example, types of input data groups in various embodiments include image data, text data, video data, and audio data. Each format of the plurality of formats corresponds to the type of data. For example, audio data may be in a first format, video data may be in a different, second format, and so on. The input data in various embodiments is provided in connection with performance of a maintenance task, for example during performance of the maintenance task based on information discovered or generated during performance of the maintenance task.

At 304, a particular format is identified (e.g., by processing unit 130) for each input data group. The format is identified from the plurality of formats, and corresponds to the type of input data as discussed herein.

At 306, for each input data group, an intermediate representation of the input data is prepared. The intermediate representation is based on the particular format that is identified for the input data. The format may define or specify an ND array type or form. For example, in the illustrated example, at 308, an ND array is generated having an ND array format corresponding to the particular format identified at 304.

At 310, the intermediate representation is modified to provide a model input. The model input has a common format, with intermediate representations corresponding to each of the inputs from 302 being modified to the common format at 310. In various embodiments, the common format defines a common ND array format. In the illustrated example, at 312, at least one of a size or a shape of an ND array of the intermediate representation is altered to modify the intermediate representation to provide the model input.

At 314, the model input is provided to an artificial intelligence modeler. The artificial intelligence modeler, in some embodiments, is configured to develop a model using the model input. Alternatively or additionally, in some embodiments, the artificial intelligence modeler uses the model input to use the model (e.g., as part of an evaluation and/or guidance of performance of a maintenance task).

Figure 4:
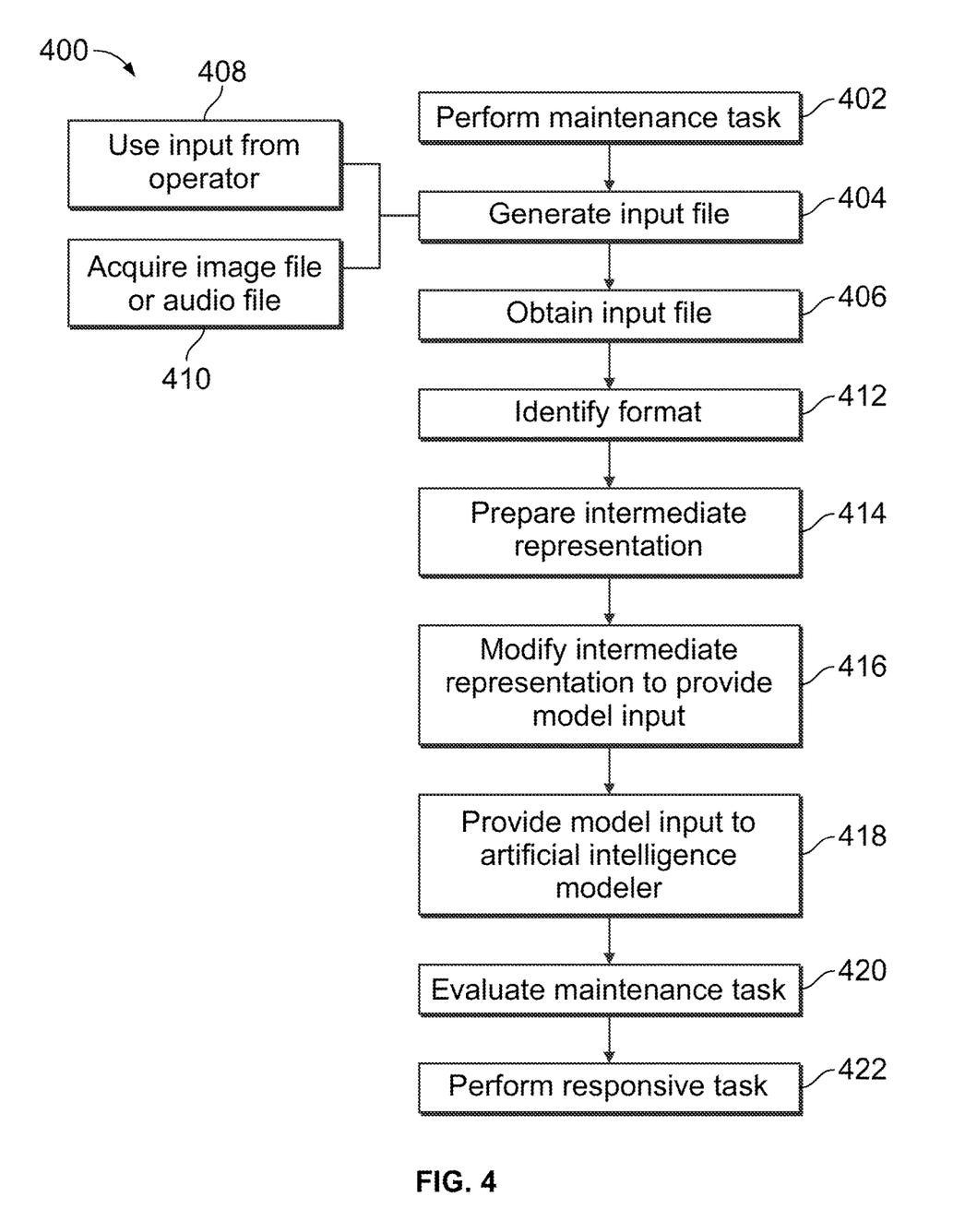
FIG. 4 illustrates a flowchart of a method.

FIG. 4 illustrates a flowchart of a method 400. The operations of FIG. 4 may be implemented by one or more processors (e.g., processing unit 130 and/or artificial intelligence modeler 190) executing program instructions stored in memory. The method 400, for example, may employ structures or aspects of various embodiments (e.g., systems and/or methods) discussed herein, such as the system 100 and/or system flow 200 and/or method 300. In various embodiments, certain steps (or operations) may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. In various embodiments, portions, aspects, and/or variations of the method 400 may be used as one or more algorithms to direct hardware to perform one or more operations described herein. It should be noted, other methods may be used, in accordance with embodiments herein.

At 402, a maintenance task is performed. The maintenance task in various embodiments includes one or more of cleaning, inspection, repair, or replacement of one or more components. In various embodiments, the maintenance task is performed on one or more components of a vehicle.

At 404, an input data is generated (e.g., by maintenance task input unit 110). The input data includes information that corresponds to the maintenance task. The input data in various embodiments is generating using one or more of a keyboard or other manual input, a camera, or a microphone. Various methods and/or equipment may be used to generate the input data. For example, at 408, the input data is generated using an input from an operator performing the maintenance task. As another example, at 410, at least one of an image file is acquired (e.g., via a camera) or an audio file is acquired (e.g., via a microphone).

At 406, the input data is obtained by one or more processors (e.g., processing unit 130). The input data is in a format corresponding to the type of input data generated at 404.

At 412, a particular format for the input data is identified. At 414, an intermediate representation is prepared. The intermediate representation is prepared based on the particular format identified at 412.

At 416, the intermediate representation is modified to provide a model input. The model input has a common format. Intermediate representations corresponding to each of the plurality of inputs are modified to the same, common format.

At 418, the model input is proved to an artificial intelligence modeler. The modeler is configured to use the model input to at least one of develop or use a model using the model input.

For example, in the illustrated embodiment, at 420, a maintenance task is evaluated using the model. At 422, a responsive task is performed corresponding to the output of the model. For example, if a cleaning task is evaluated as being not satisfactorily completed at 420, an instruction to an operator may be provided at 422 to continue cleaning. Or as another example, a control signal may be provided to an automated machine to perform a cleaning step responsive to an evaluation that a component is not sufficiently clean. As another example, if a repair task is evaluated as being not satisfactorily completed at 420, an instruction to an operator may be provided at 422 to continue repair work, implement a different repair technique, or replace a component for which repair work is deemed impractical, as appropriate.

In an embodiment, a system (e.g., a maintenance system) includes a maintenance task input unit and one or more processors. The maintenance task input unit is configured to generate plural input data groups corresponding to a maintenance task. Each of the input data groups is in a corresponding one of plural formats. The one or more processors are coupled to the maintenance task input unit and configured to obtain the plural input data groups from the maintenance task input unit. The one or more processors are configured to identify a particular format of the formats for each input data group, and to prepare an intermediate representation of the input data based on the particular format that is identified. Also the one or more processors are configured to modify the intermediate representation to provide a model input having a common format. The one or more processors are configured to modify intermediate representations corresponding to each of the input data groups to the common format, and to provide the model input to a maintenance system artificial intelligence modeler that is configured to use the model input to at least one of develop or use a model using the model input for vehicle maintenance.

Optionally, the one or more processors are configured to prepare the intermediate representation by generating an n-dimensional array having an n-dimensional array format corresponding to the particular format identified. For example, in some embodiments, the common format defines a common n-dimensional array format.

Optionally, the plurality of formats includes at least one of an image format, a text format, a video format, or an audio format.

Optionally, the one or more processors are configured to modify the intermediate representation to provide the model input by altering at least one of a size or a shape of an n-dimensional array of the intermediate representation.

Optionally, the model is configured to provide an evaluation of the maintenance task. For example, in some embodiments, the maintenance task input unit is configured to generate the input data by acquiring an input from an operator performing the maintenance task. As another example, in some embodiments, the maintenance task input unit is configured to generate the input data by at least one of acquiring image information or acquiring audio information corresponding to the maintenance task.

In an embodiment, a method includes obtaining plural input data groups of input information corresponding to a maintenance task. Each of the input data groups is in a corresponding one of a plurality of formats. The method also includes identifying a particular format of the plurality of formats for each input data group, and preparing an intermediate representation of the input data based on the particular format that is identified for each input data group. Further, the method includes modifying the intermediate representation to provide a model input having a common format. Intermediate representations corresponding to each of the plurality of inputs are modified to the common format. The method also includes providing the model input to an artificial intelligence modeler that is configured to use the model input to at least one of develop or use a model using the model input.

Optionally, preparing the intermediate representation comprises generating an n-dimensional array having an n-dimensional array format corresponding to the particular format identified. For example, in some embodiments, the common format defines a common n-dimensional array format.

Optionally, the plurality of formats includes at least one of an image format, a text format, a video format, or an audio format.

In some embodiments, modifying the intermediate representation to provide the model input comprises altering at least one of a size or a shape of an n-dimensional array of the intermediate representation. Optionally, the method also includes performing the maintenance task, generating the input data including information corresponding to the maintenance task, evaluating the maintenance task using the model; and performing a responsive task corresponding to an output of the model. In some embodiments, obtaining the input data comprises acquiring an input from an operator performing the maintenance task. In some embodiments, obtaining the input data comprises at least one of acquiring an image file or acquiring an audio file corresponding to the maintenance task.

In an embodiment, a method includes performing a maintenance task, and generating input data including information corresponding to the maintenance task. The method also includes obtaining, with one or more processors, the input data of input information in a corresponding one of a plurality of formats. Further, the method includes identifying a particular format of the plurality of formats for the input data, and preparing an intermediate representation of the input data based on the particular format that is identified. The method also includes modifying the intermediate representation to provide a model input having a common format. The intermediate representations corresponding to each of the plurality of inputs are modified to the common format. Further, the method includes providing the model input to an artificial intelligence modeler that is configured to use the model input to at least one of develop or use a model using the model input.

Optionally, the method may further include evaluating the maintenance task using the model, and performing a responsive task corresponding to an output of the model. In some embodiments, obtaining the input data comprises acquiring an input from an operator performing the maintenance task. In some embodiments, obtaining the input data comprises at least one of acquiring an image file or acquiring an audio file corresponding to the maintenance task.

The singular forms "a", "an", and "the" include plural references unless the context clearly dictates otherwise. "Optional" or "optionally" means that the subsequently described event or circumstance may or may not occur, and that the description may include instances where the event occurs and instances where it does not. Approximating language, as used herein throughout the specification and claims, may be applied to modify any quantitative representation that could permissibly vary without resulting in a change in the basic function to which it may be related. Accordingly, a value modified by a term or terms, such as "about," "substantially," and "approximately," may be not to be limited to the precise value specified. In at least some instances, the approximating language may correspond to the precision of an instrument for measuring the value. Here and throughout the specification and claims, range limitations may be combined and/or interchanged, such ranges may be identified and include all the sub-ranges contained therein unless context or language indicates otherwise.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein. Instead, the use of "configured to" as used herein denotes structural adaptations or characteristics, and denotes structural requirements of any structure, limitation, or element that is described as being "configured to" perform the task or operation. For example, a processing unit, processor, or computer that is "configured to" perform a task or operation may be understood as being particularly structured to perform the task or operation (e.g., having one or more programs or instructions stored thereon or used in conjunction therewith tailored or intended to perform the task or operation, and/or having an arrangement of processing circuitry tailored or intended to perform the task or operation). For the purposes of clarity and the avoidance of doubt, a general purpose computer (which may become "configured to" perform the task or operation if appropriately programmed) is not "configured to" perform a task or operation unless or until specifically programmed or structurally modified to perform the task or operation.

It should be noted that the particular arrangement of components (e.g., the number, types, placement, or the like) of the illustrated embodiments may be modified in various alternate embodiments. For example, in various embodiments, different numbers of a given module or unit may be employed, a different type or types of a given module or unit may be employed, a number of modules or units (or aspects thereof) may be combined, a given module or unit may be divided into plural modules (or sub-modules) or units (or sub-units), one or more aspects of one or more modules may be shared between modules, a given module or unit may be added, or a given module or unit may be omitted.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid state drive, optic drive, and the like. The storage device may also be other similar means for loading computer programs or other instructions into the computer or processor.

As used herein, the term "computer," "controller," "processing unit" and "module" may each include any processor-based or microprocessor-based system including systems using microcontrollers, reduced instruction set computers (RISC), application specific integrated circuits (ASICs), logic circuits, GPUs, FPGAs, and any other circuit or processor capable of executing the functions described herein. The above examples are exemplary only, and are thus not intended to limit in any way the definition and/or meaning of the term "module" or "computer."

The computer, module, or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer, module, or processor as a processing machine to perform specific operations such as the methods and processes of the various embodiments described and/or illustrated herein. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program. The individual components of the various embodiments may be virtualized and hosted by a cloud type computational environment, for example to allow for dynamic allocation of computational power, without requiring the user concerning the location, configuration, and/or specific hardware of the computer system.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the embodiments, including the best mode, and to enable a person of ordinary skill in the art to practice the embodiments, including making and using any devices or systems and performing any incorporated methods. The claims define the patentable scope of the disclosure, and include other examples that occur to those of ordinary skill in the art. Such other examples are intended to be within the scope of the claims if they have structural elements that do not differ from the literal language of the claims, or if they include equivalent structural elements with insubstantial differences from the literal language of the claims.

What is claimed is:
1. A system comprising:
   a maintenance task input unit configured to generate a plurality of input data groups, wherein the plurality of input data groups correspond to a maintenance task performed on a component of a vehicle, wherein each of the plurality of input data groups corresponds to a different format of a plurality of formats, and wherein the maintenance task input unit comprises one or more of a keyboard, a manual input peripheral device, a camera, a microphone, or any combination thereof; and one or more processors communicably coupled to the maintenance task input unit, the one or more processors are configured to:
obtain the plurality of input data groups from the maintenance task input unit;
identify a particular format of the plurality of formats for each of the plurality of input data groups;
generate a plurality of intermediate representations corresponding to each of the plurality of input data groups, wherein the plurality of intermediate representations are based on the particular format for each of the plurality of input data groups;
modify the plurality of intermediate representations corresponding to each of the plurality of input data groups to provide a plurality of model inputs, wherein each of the plurality of model inputs are modified to have a common format; and
evaluate the plurality of model inputs with a maintenance system artificial intelligence modeler, wherein the maintenance system artificial intelligence modeler compares the plurality of model inputs to a completed maintenance task; and
determine a sufficiency assessment of the maintenance task.

2. The system of claim 1, wherein the one or more processors are configured to prepare the plurality of intermediate representations by generating an n-dimensional array having an n-dimensional array format corresponding to the particular format for each of the plurality of input data groups.

3. The system of claim 2, wherein the common format defines a common n-dimensional array format.

4. The system of claim 1, wherein the plurality of formats include at least one of an image format, a text format, a video format, or an audio format.

5. The system of claim 1, wherein the one or more processors are configured to modify the plurality of intermediate representations to generate the plurality of model inputs by altering at least one of a size or a shape of an n-dimensional array of the plurality of intermediate representations.

6. The system of claim 1, wherein the maintenance task input unit is configured to generate the plurality of input data groups by at least one of acquiring image information or acquiring audio information corresponding to the maintenance task performed on the component of the vehicle.

7. The system of claim 1, wherein the one or more processors are further configured to perform a responsive task based on the sufficiency assessment of the maintenance task.

8. The system of claim 1, wherein the sufficiency assessment of the maintenance task comprises completed satisfactory, completed unsatisfactory, or incomplete.

9. A method comprising:
obtaining a plurality of input data groups of input information corresponding to a maintenance task performed on a component of a vehicle, wherein each of the plurality of input data groups corresponds to a different format of a plurality of formats;
identifying a particular format of the plurality of formats for each of the plurality of input data groups;
generating a plurality of intermediate representations of the plurality of input data groups based on the particular format that is identified for each of the plurality of input data groups;
modifying the plurality of intermediate representations corresponding to the plurality of input data groups to provide a plurality of model inputs, wherein each of the plurality of model inputs are modified to have a common format;
evaluating the plurality of model inputs with a maintenance system artificial intelligence modeler, wherein the maintenance system artificial intelligence modeler compares the plurality of model inputs to a maintenance task; and
determining a sufficiency assessment of the maintenance task.

10. The method of claim 9, wherein preparing the plurality of intermediate representations comprises generating an n-dimensional array having an n-dimensional array format corresponding to the particular format for each of the plurality of input data groups.

11. The method of claim 10, wherein the common format defines a common n-dimensional array format.

12. The method of claim 9, wherein the plurality of formats include at least one of an image format, a text format, a video format, or an audio format.

13. The method of claim 9, wherein modifying the plurality of intermediate representations to provide generate the plurality of model inputs by altering at least one of a size or a shape of an n-dimensional array of the plurality of intermediate representations.

14. The method of claim 9, wherein obtaining the plurality of input data groups comprises at least one of acquiring an image file or acquiring an audio file corresponding to the maintenance task performed on the component of the vehicle.

15. The method of claim 9, further comprising:
performing a responsive task based on the sufficiency assessment of the maintenance task, wherein the sufficiency assessment is completed unsatisfactory or incomplete.

16. A method comprising:
obtaining maintenance task data for a maintenance task on a component of a vehicle;
generating an input data including input information corresponding to the maintenance task data;
obtaining, by one or more processors, the input data of the input information, wherein the input data corresponds to a plurality of formats;
identifying a particular format of the plurality of formats for the input data;
generating an intermediate representation of the input data based on the particular format that is identified;
modifying the intermediate representation to provide a model input having a common format;
evaluating the model input with a maintenance system artificial intelligence modeler, wherein the maintenance system artificial intelligence modeler compares the model input to a maintenance task; and
determining a sufficiency assessment of the maintenance task.

17. The method of claim 16, wherein obtaining the input data comprises at least one of acquiring an image file or acquiring an audio file corresponding to the maintenance task.

18. The method of claim 16, further comprising:
performing a responsive task based on the sufficiency assessment of the maintenance task, wherein the sufficiency assessment is completed unsatisfactory or incomplete.

* * * * *